United States Patent
Shoolman et al.

(10) Patent No.: US 8,954,478 B2
(45) Date of Patent: Feb. 10, 2015

(54) SYSTEMS, METHODS, AND MEDIA FOR MANAGING RAM RESOURCES FOR IN-MEMORY NOSQL DATABASES

(71) Applicants: Yiftach Shoolman, Modi'in (IL); Ofer Bengal, Hod Hasharon (IL)

(72) Inventors: Yiftach Shoolman, Modi'in (IL); Ofer Bengal, Hod Hasharon (IL)

( * ) Notice: Subject to any disclaimer, the term of this patent is extended or adjusted under 35 U.S.C. 154(b) by 126 days.

(21) Appl. No.: 13/853,011

(22) Filed: Mar. 28, 2013

(65) Prior Publication Data
US 2013/0232177 A1 Sep. 5, 2013

Related U.S. Application Data

(63) Continuation-in-part of application No. 13/247,263, filed on Sep. 28, 2011, now Pat. No. 8,595,268.

(60) Provisional application No. 61/616,425, filed on Mar. 28, 2012, provisional application No. 61/802,158, filed on Mar. 15, 2013, provisional application No. 61/387,255, filed on Sep. 28, 2010, provisional application No. 61/427,492, filed on Dec. 28, 2010.

(51) Int. Cl.
*G06F 7/00* (2006.01)
*G06F 17/30* (2006.01)
*H03M 7/00* (2006.01)
*H03M 7/30* (2006.01)

(52) U.S. Cl.
CPC .......... *G06F 17/30289* (2013.01); *H03M 7/00* (2013.01); *H03M 7/3088* (2013.01); *H03M 7/707* (2013.01)

USPC ............ 707/803; 707/802; 707/702; 707/792

(58) Field of Classification Search
CPC .................. G06F 17/30486; G06F 17/30584; G06F 17/30283; G06F 17/30289; G06F 3/0629; G06F 3/0631; G06F 12/0871; G06F 17/30312
USPC ......... 707/609, 610, 620, 626, 634, 638, 702, 707/791–793, 803, 804
See application file for complete search history.

(56) References Cited

U.S. PATENT DOCUMENTS

| | | |
|---|---|---|
| 7,420,992 B1 | 9/2008 | Fang et al. |
| 2008/0215602 A1* | 9/2008 | Samson et al. ............... 707/101 |
| 2008/0235292 A1 | 9/2008 | Janin et al. |
| 2010/0153466 A1* | 6/2010 | Burger ........................ 707/802 |
| 2010/0185593 A1 | 7/2010 | Wong et al. |
| 2012/0054197 A1 | 3/2012 | San Martin et al. |

OTHER PUBLICATIONS

IBM "A System of Reducing Down Time in a Cached In-Memory Database Environmental Using Checkpointing Mechanism" IP.Com Prior Art Database Technical Disclosure Apr. 14, 2009.*

(Continued)

*Primary Examiner* — Augustine K Obisesan
*Assistant Examiner* — Berhanu Mitiku
(74) *Attorney, Agent, or Firm* — Byrne Poh LLP

(57) ABSTRACT

In some embodiments, systems for managing an in-memory NoSQL database are provided, the systems comprising a hardware processor that is configured to: receive a dataset; split the dataset into a plurality of parts of the dataset; and storing each of the plurality of parts of the dataset in a separate one of plurality of 32-bit software architecture in-memory NoSQL databases.

6 Claims, 10 Drawing Sheets

(56) References Cited

OTHER PUBLICATIONS

DeCandia, G., et al., "Dynamo: Amazon's Highly Available Key-Value Store", In Proceedings of the Symposium on Operating Systems Principles (SOSP '07), Stevenson, WA, USA, Oct. 14-17, 2007, pp. 205-220.

Notice of Allowance dated Jul. 23, 2013 in U.S. Appl. No. 13/247,263.
Office Action dated Aug. 4, 2014 in U.S. Appl. No. 14/064,891.
Office Action dated Oct. 13, 2011 in U.S. Appl. No. 13/247,263.
Office Action dated Oct. 17, 2011 in U.S. Appl. No. 13/247,371.

* cited by examiner

SYSTEMS, METHODS, AND MEDIA FOR MANAGING RAM RESOURCES FOR IN-MEMORY NOSQL DATABASES

CROSS REFERENCE TO RELATED APPLICATIONS

This application claims the benefit of U.S. Provisional Patent Application No. 61/616,425, filed Mar. 28, 2012, which is hereby incorporated by reference herein in its entirety. This application claims the benefit of U.S. Provisional Patent Application No. 61/802,158, filed Mar. 15, 2013, which is hereby incorporated by reference herein in its entirety. This application is also a continuation-in-part of U.S. patent application Ser. No. 13/247,263, filed Sep. 28, 2011, which claims the benefit of U.S. Provisional Patent Application No. 61/387,255, filed Sep. 28, 2010, and U.S. Provisional Patent Application No. 61/427,492, filed Dec. 28, 2010, each of which is hereby incorporated by reference herein in its entirety.

BACKGROUND

Many Web 2.0 and Software as a Service (SaaS) applications rely heavily on user created content. This reliance drives the need for (a) efficient and reliable scaling technologies for supporting rapid data growth; and (b) better storage and retrieval technology. Much of this user-created content only requires a primary key for store and retrieve commands rather than complex querying and management functionality offered by traditional Relational Database Management Systems (RDBMS's). The excess RDBMS functionality involves expensive hardware and highly skilled personnel, typically making it unsuitable for these types of applications. In-addition, RDBMS replication capabilities are limited and typically prefer consistency over performance and availability. Despite many developments in recent years, scaling-out a relational database is still very complex.

During recent years NoSQL (Not Only SQL) database management systems (which are also referred to as non-relational databases or unstructured databases) have emerged in-order to solve these RDBMS deficiencies. NoSQL is a broad class of database management systems that can differ from classic RDBMS in some significant ways: (1) there are no inherent relations between stored objects; (2) the data stores may not require fixed table schemas; and (3) NoSQL avoids join operations and typically scales horizontally.

In-memory non-relational databases are subset of NoSQL databases, and are designed in a way that all of (or a major part of) the users dataset is stored in RAM Memory. In-memory non-relational databases are usually in two to three orders of magnitude faster (in terms of throughput and latency) than RDBMS's and an order of magnitude faster than other NoSQL databases.

Among the in-memory non-relational databases, the open source Memcached was first to emerge intending to solve many of the RDBMS issues of read operations, by adding to RDBMS a simple distributed key-value caching system. However, Memcached does not include a data-management layer, and therefore provides no support for high-availability and data-persistence. In addition, during scaling events, Memcached loses all, or significant part of its data.

Redis, an emerging open-source in-memory non-relational database improves Memcached's offering by supporting write operations, persistence storage and high-availability, using a data management-layer for the stored objects. But Redis is built over a single master multi-slave architecture, and therefore suffers from master scaling problems.

Furthermore, due to the relatively high price of Random Access Memory (RAM) resources (as of March 2013, RAM prices are approximately 200 times higher than HDD (Hard Disk Drive)), in-memory non-relational databases may be very expensive. Accordingly, in order to reduce the footprint of in-memory datasets, various techniques that rely on compression and object serialization have been developed. However, such techniques often increase the latency and processing overheads of in-memory non-relational databases beyond what is acceptable. In many cases, sub-millisecond latency is required even at loads exceeding 100,000 requests per second on a single server.

Accordingly, there is a need for new methods, systems, and media for managing an managing in-memory NoSQL database.

SUMMARY

Systems, methods, and media for managing an in-memory NoSQL database are provided. In some embodiments, methods for managing an in-memory NoSQL database are provided, the methods comprising: receiving a dataset; splitting, by a hardware processor, the dataset into a plurality of parts of the dataset; and storing each of the plurality of parts of the dataset in a separate one of a plurality of 32-bit software architecture in-memory NoSQL databases.

In some embodiments, systems for managing an in-memory NoSQL database are provided, the systems comprising a hardware processor that is configured to: receive a dataset; split the dataset into a plurality of parts of the dataset; and storing each of the plurality of parts of the dataset in a separate one of a plurality of 32-bit software architecture in-memory NoSQL databases.

In some embodiments, non-transitory computer-readable media are provided containing computer-executable instructions that, when executed by a processor, cause the processor to perform a method for managing an in-memory NoSQL database, the method comprising: receiving a dataset; splitting, by a hardware processor, the dataset into a plurality of parts of the dataset; and storing each of the plurality of parts of the dataset in a separate one of a plurality of 32-bit software architecture in-memory NoSQL databases.

DETAILED DESCRIPTION

Systems, methods, and media for managing an in-memory NoSQL database are provided.

Figure 1:
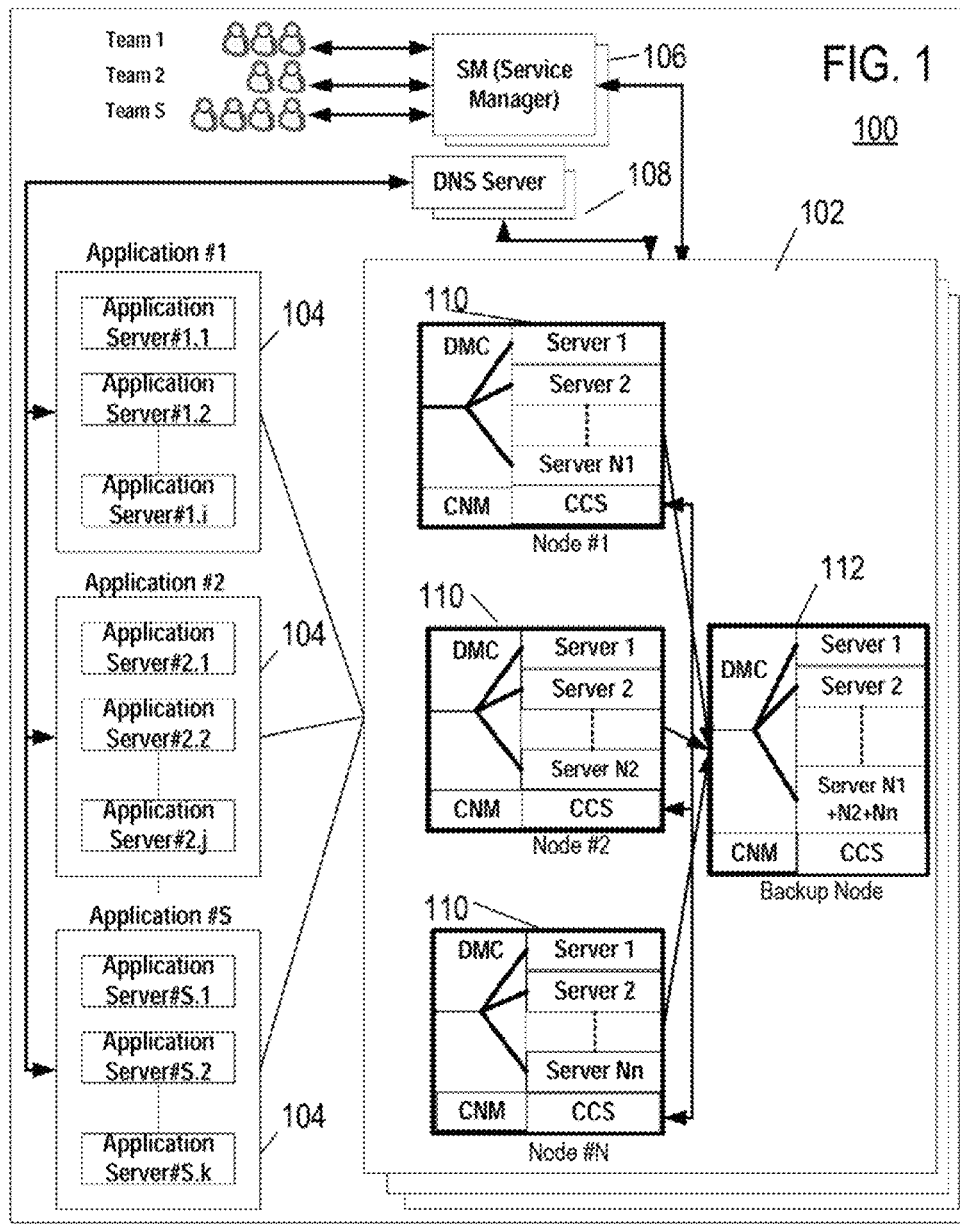
FIG. 1 is a diagram of an example of a cluster architecture in accordance with some embodiments.

In accordance with some embodiments, an in-memory non-relational database can be implemented as a system 100 as illustrated in FIG. 1. As shown, system 100 can include one or more clusters 102, one or more applications 104, one or more service managers 106, and one or more domain name servers 108. Clusters 102 can be one or more clusters of nodes 110 for providing in-memory data storage as well as related functionality as described further below. Applications 104 can be one or more applications that use data and related information stored in nodes 102. Service manager (SM) 106 can be an entity that manages the user interaction with the system, as well as maps user configuration to cluster resources. The SM can be designed to support single- and multi-tenancy modes of operation, and can allow the system to be supplied as a service. The SM can also communicate with a cluster node manager of a node (described below) for aggregating service statistics and alarms. When deployed as a service, the SM can also be responsible for usage reports and billing. DNS 108 can provide a mechanism for domain name server functions as known in the art.

Figure 2:
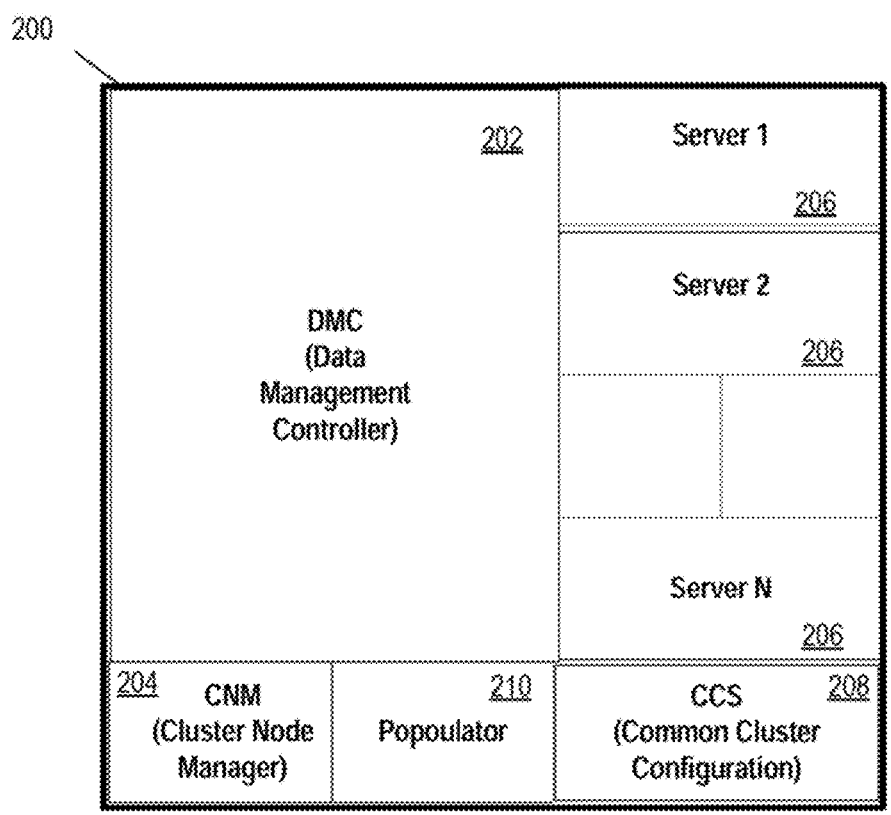
FIG. 2 is a diagram of an example of a node architecture in accordance with some embodiments.

Turning to FIG. 2, an example of a node 200 that can be used as a node 110 in a cluster 102 in accordance with some embodiments is illustrated. As shown, node 200 can include a data management controller (DMC) 202, a cluster node manager (CNM) 204, zero or more servers 206, and common cluster storage 208, and populator 210. As described more fully below, in some embodiments, server(s) 206 can be used to provide in-memory non-relational database functionality. In some embodiments, the server(s) can be based on the open-source Redis server with enhanced functionality. In some embodiments, the server(s) can represent one of the following options: (1) a Memcached Bucket; (2) a partition of a Memcached Bucket; (3) a Redis database (DB); or (4) a partition of a Redis DB.

In some embodiments, node 200 may be implemented using physical hardware, such as a computer and/or a blade server. Additionally or alternatively, in some embodiments, node 200 may be implemented as a virtual server in a virtual environment, such as a computer cloud.

In some embodiments, DMC 202, CNM 204, and/or populator 210 may be implemented as one or more processes that are executed on node 200. Any suitable system topology may be used, in some embodiments.

In some embodiments, each of servers 206 may be implemented as one or more software processes that are executed on node 200. Moreover, in some embodiments, any of servers 206 may be implemented in 32-bit computer software instead of 64-bit software. Because the size of a word in 32-bit software is half the size of as 64-bit word, using 32-bit computer software may cause a decrease in memory overhead resulting from the use of pointers (which are one word in size). Regardless of whether any of servers 206 are implemented in 32-bit software or 64-bit software, servers 206 may be executed on 64-bit hardware (e.g., executed by a 64-bit hardware processor). Although servers 206 are depicted as processes executed on the same node, in some embodiments, one or more of servers 206 may be executed on a different node than the rest of servers 206.

In some embodiments, data that is stored in the database may be organized in key-value pairs. In some embodiments, the key-value pairs may be part of various database objects. The key of each pair may be any symbol, letter, digit, number, string, and/or any other suitable information representation that is usable to retrieve the same pair's data structure from the database. The value of each pair may be a digit, string, a hash, a linked list, a skip list, and/or any other suitable type of object, and/or any other suitable information representation. Any suitable implementation of database data structures may be used in some embodiments.

In some embodiments, a database data structure (or a value that is part of the data structure) may be considered to be associated with a key, if that key is usable to retrieve the data structure's value from the database. Additionally or alternatively, in some embodiments, a database data structure may be considered to be associated with a key, if that key references the data structure.

Figure 5:
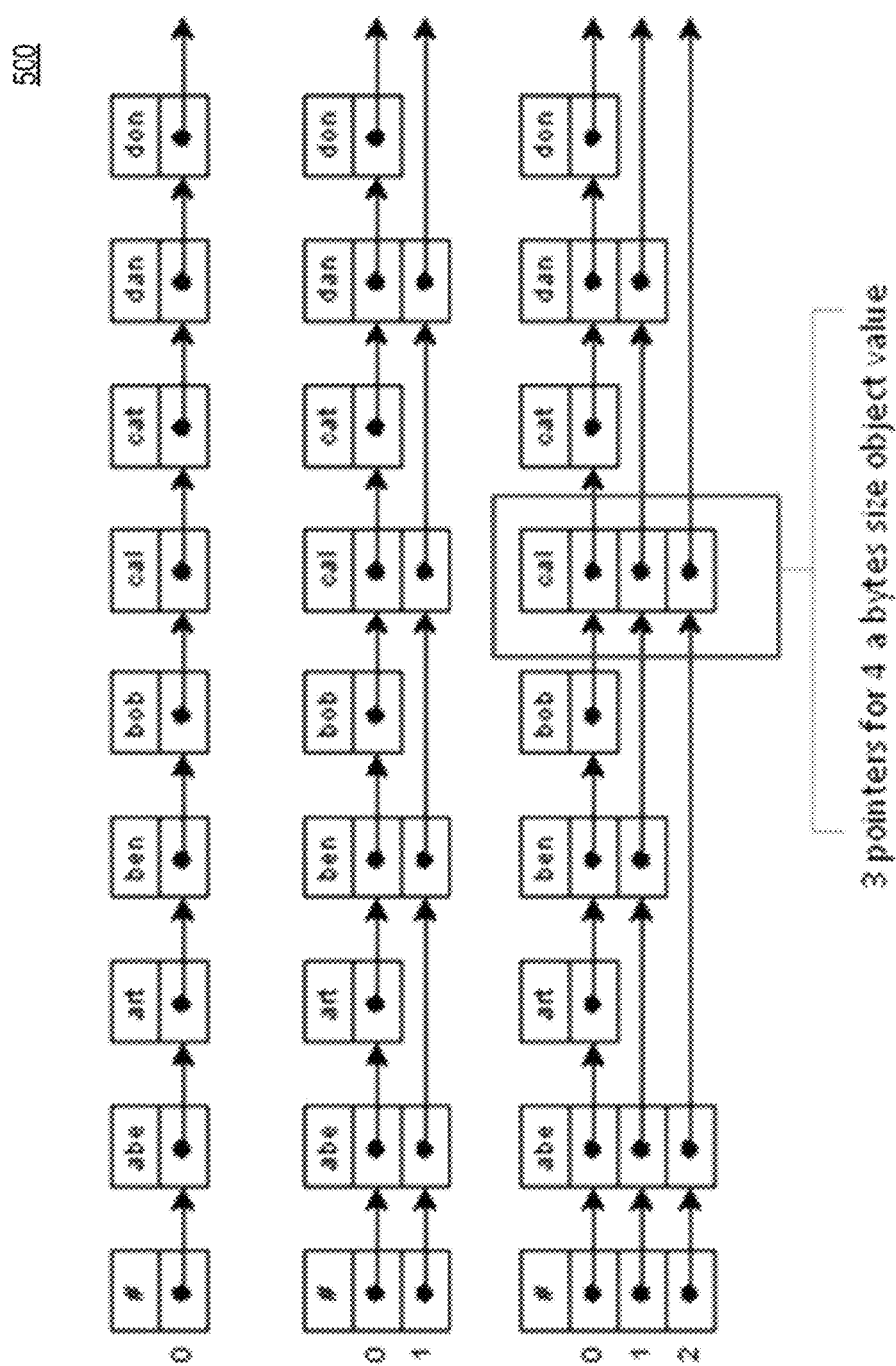
FIG. 5 is a diagram of an example of a skip list data structure in accordance with some embodiments.

In some embodiments, complex data structures, such as skip lists and linked lists, may include large numbers of pointers for each value stored in them in order to permit commands, such as search, intersect, or union, to be executed. The large numbers of pointers may result in a significant memory overhead. For example, as illustrated in FIG. 5, elements in a skip list 500 (when skip list 500 is implemented using 64-bit software) may have 4-byte values, with each 4-byte value being associated with 3 pointers (24 bytes in total). Thus, in some instances, the overhead costs introduced by the management of pointers may reach 87.5% (including memory alignment overhead).

In some embodiments, this overhead may be reduced by implementing one or more of servers 206 in 32-bit software. Using servers implemented in 32-bit software may reduce the memory overhead by half without causing any significant loss of performance and/or functionality, as compared to servers implemented in 64-bit software. As noted above, in embodiments in which servers 206 are implemented in 32-bit computer software, pointers can be only 4-bytes in size, rather than 8 bytes as is the case with 64-bit architectures. This can represent a 50% savings in memory overhead for every stored object.

In some aspects, servers running on 32-bit software architectures may run out of memory faster than those servers that are implemented in 64-bit software. The memory address space of 32-bit servers may include 4096 billion different addresses, whereas the memory space available in 64-bit architectures may be virtually unlimited (e.g., it may include $1.8 \times 10^{19}$ addresses). Thus, 32-bit servers may be much more likely to run out of available memory space than their 64-bit counterparts when deployed in a data-intensive setting. Accordingly, as is discussed further below, techniques for rebalancing the data that is stored on servers may be deployed that prevent the servers from running out of available memory addresses when the servers are implemented using low-bit (e.g., 32-bit) software. Examples of such techniques are provided with respect to FIGS. 3F and 3E.

In some embodiments, DMC 202 and/or CNM 204 may be used to implement a database (or bucket) that is hosted on a plurality of servers (e.g., server 206). Any suitable type of servers may be used to implement the database. The database may include low-bit servers only (e.g., servers that are implemented in 32-bit software or otherwise have a smaller address space than high-bit servers), high-bit servers only e.g., servers having a larger address space than the low-bit servers), or any suitable combination of low-bit and high-bit servers (e.g., combination of 32-bit servers and 64-bit servers executed on 64-bit processors). DMC 202 and/or CNM 204 may implement an intermediate layer that is used to organize the database into partitions. The intermediate layer may be situated between applications that use the database and the plurality of servers. The intermediate layer may be transparent to both client applications that use the database and to the servers that host the database.

Each partition may be a logical unit that includes a plurality of database values. The number of partitions in a database may be fixed throughout the life of the database, in some embodiments. The size of the partitions may be variable. Whether a data structure belongs to a given partition may depend on whether a key associated with the database data structure is mapped (e.g., by a hashing function and/or a mapping structure) to an ID of given the partition. Servers that host the database may store multiple partitions or only one partition. When the address space capacity of servers becomes close to being reached, new servers may be instantiated, and partitions stored in the latter servers may be relocated to the new servers.

Figure 3A:
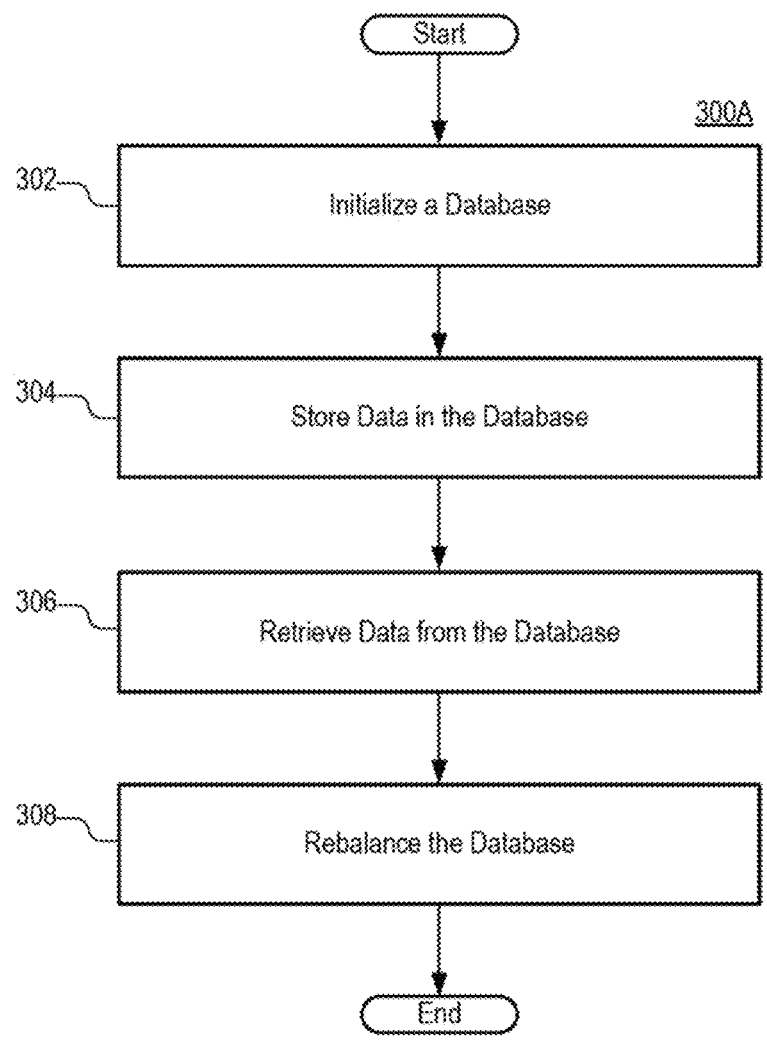
FIG. 3A is a diagram of an example of a process for managing a database in accordance with some embodiments.

An example of the implementation and use of database partitions is provided in connection to FIGS. 3A-3F. FIG. 3A depicts a flowchart of an example of a process 300A for managing a database in accordance with some embodiments of the disclosed subject matter. In some embodiments, process 300A may be performed by CNM 204. Additionally or alternatively, process 300A may be performed by processors) execute CNM 204. At 302, a database is initialized. As noted above, the database may be hosted on a plurality of servers and it may include low-bit servers only, high bit servers only, or any suitable combination of low-bit and high-bit servers. At 304, data is stored in the database. At 306, data is retrieved from the database. At 308, the database is rebalanced in order to address the problem of a first server (e.g., a low-bit server) running out of available address space.

Figure 3B:
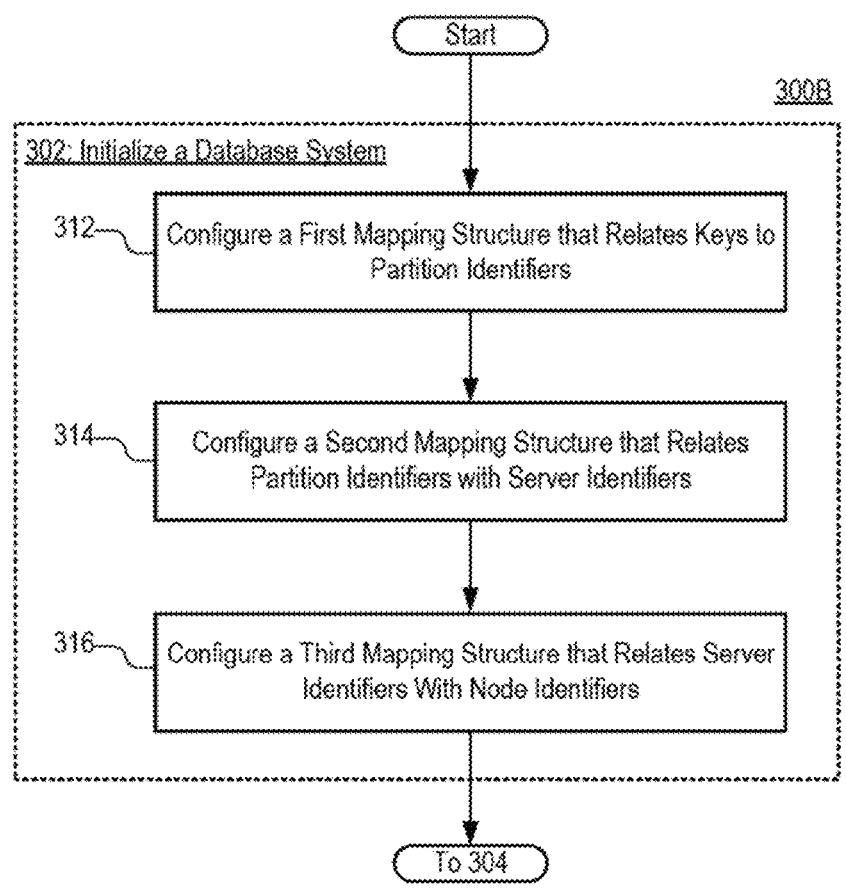
FIG. 3B is a diagram of an example of a process for initializing a database in accordance with some embodiments.

FIG. 3B depicts a flowchart of a process 300B for configuring a database in accordance with some embodiments of the disclosed subject matter. Process 300B, in some embodiments, may be used to perform step 302 of process 300A. At 312, a first mapping structure that relates keys to partition IDs is configured. Configuring the first mapping structure may include one or more of instantiating the mapping structure, updating the mapping structure, and/or performing any other suitable action. Any of the keys may include a number, a string, or an alphanumerical string that is usable to retrieve data from servers that are used to implement the database. Additionally or alternatively, in some embodiments, any of the keys may include a number, a string, or an alphanumerical string that is usable to store data from the servers that are used to implement the database. Any of the partition IDs may include a number, a string, an alphanumerical string, and/or any other suitable type of identifiers. As noted above, each partition may include one or more database objects. Each database object may include a key and a value, with the key being usable to retrieve the value. The database objects may include a key and a value and/or any other suitable unit of data. More particularly, in some embodiments, in order for a database object to be considered part of a partition (i.e., associated with a partition), the ID of that partition needs to be associated with a key that is part of the object by the first mapping structure.

The first mapping structure may include data (e.g., a table), executable code, and/or any suitable type of information that is capable of being used to identify a partition ID that is associated with a given key. In some embodiments, the first mapping structure may be implemented as a table that relates keys to partition IDs. Additionally or alternatively, in some embodiments, the first mapping structure may implement a hashing function. For example, the hashing function may be one that uses the key as an argument and evaluates to a partition ID. Thus, in some embodiments, the hashing function may map a key space (e.g., a key space that includes all possible keys that can be used in the database) to a partition space (e.g., a space that includes the identifiers of all partitions into which the database is divided). Any suitable hashing function may be used in some embodiments. For example, CRC16 or SHA1 may be used.

At 314, a second mapping structure is configured that relates partition IDs to server IDs. The second mapping structure may include data (e.g., a table), executable code, and/or any suitable type of information that is capable of being used to identify a server ID that is associated with a given partition ID. In some embodiments, the second mapping structure may be implemented as a table that relates partition IDs to server IDs. Any suitable implementation of the second mapping structure may be used in some embodiments. Configuring the second mapping structure may include one or more of instantiating the napping structure, updating the mapping structure, and/or performing any other suitable action. Any of the server IDs may include a number, a string, an alphanumerical string, and/or any other suitable type of identifiers. In some embodiments, for any one of the plurality of partitions in the database, the second mapping structure may identify a server where data corresponding to the partition is stored. In some embodiments, data corresponding to a partition may include one or more database objects, wherein a key of any of the database objects is associated with the ID of the partition by the first mapping structure.

At 316, a third mapping structure is configured that relates server IDs to node IDs. The third mapping structure may include data (e.g., a table), executable code, and/or any suitable type of information that is capable of being used to identify a node ID that is associated with a given server ID. In some embodiments, the third mapping structure may be implemented as a table that relates server IDs to node IDs. Any suitable implementation of the third mapping structure may be used in some embodiments. Configuring the third mapping structure may include one or more of instantiating the mapping structure, updating the mapping structure, and/or performing any other suitable action. Any of the server IDs may include a number, a string, an alphanumerical string, and/or any other suitable type of identifiers. In some embodiments, for any one of the plurality of servers that are used to host the database, the third mapping structure may identify a node (e.g., physical hardware, such as a computer and/or a blade server, and/or a virtual server in a virtual environment, such as a computer cloud) on which the server is executing.

Figure 3C:
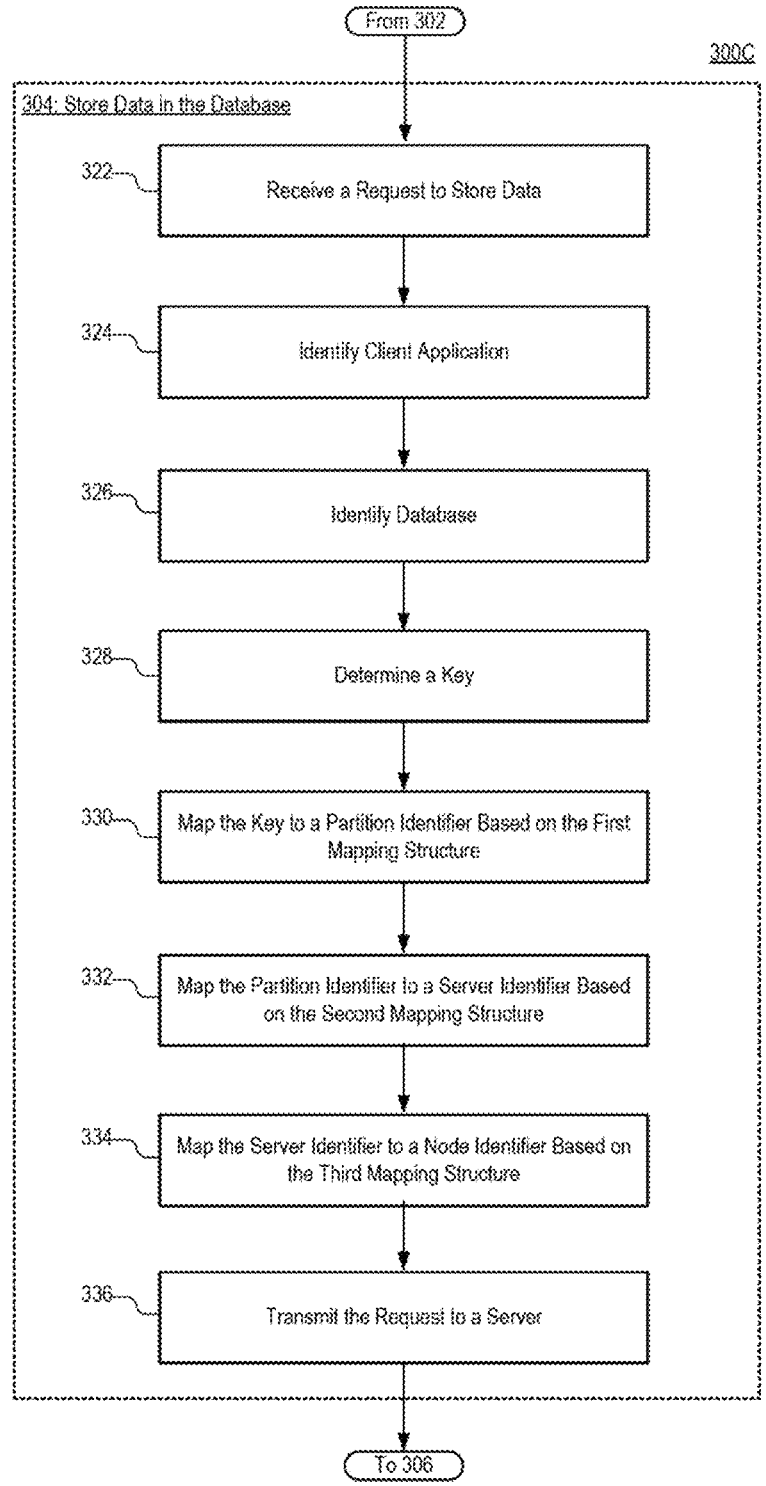
FIG. 3C is a diagram of an example of a process for storing data in a database in accordance with some embodiments.

FIG. 3C depicts a flowchart of an example of a process 300C for storing data in a database in accordance with some embodiments of the disclosed subject matter. In some embodiments, process 300C may be used to perform step 304 of process 300A. At 322, a first request may be received to store data in the database from a client application. At 324, the identity of a client and/or application that issued the first request is determined. In some embodiments, this determination can be based on data from a client authentication process. At 326, the database (or bucket) which the client is attempting to access is determined. In some embodiments, the database (or bucket) may be determined by looking at the destination port of the TCP connection from which the request has been received. Step 326 may be performed when DMC 202 and/or CNM 204 control the operation of other databases, in addition to the database discussed with respect to process 300A.

At 328, a key for the data that is to be stored is determined. In some embodiments, the key may be identified in the first request. At 330, the key is mapped to a partition ID in order to identify the partition where the data that is to be stored belongs. In some embodiments, the mapping may be performed by using a mapping structure, such as the first mapping structure. For example, in some embodiments, the partition ID may be identified by hashing the key against the database (or bucket) partition space (as defined by a hashing function) to get a partition ID. At 332, the partition ID is mapped to a server ID in order to identify the server that is hosting the partition. In some embodiments, the mapping may be performed based on the second mapping structure. At 334, the server ID is mapped to a node ID in order to identify the physical hardware (e.g., a computer or a virtual machine) that is executing the server identified at step 328. In some embodiments, the mapping may be performed based on the third mapping structure. At 336, a second request is generated based on the first request. The second request may be a request to store the data received with the first request on the server identified at step 334. The second request is transmitted to the server identified at step 334.

Figure 3D:
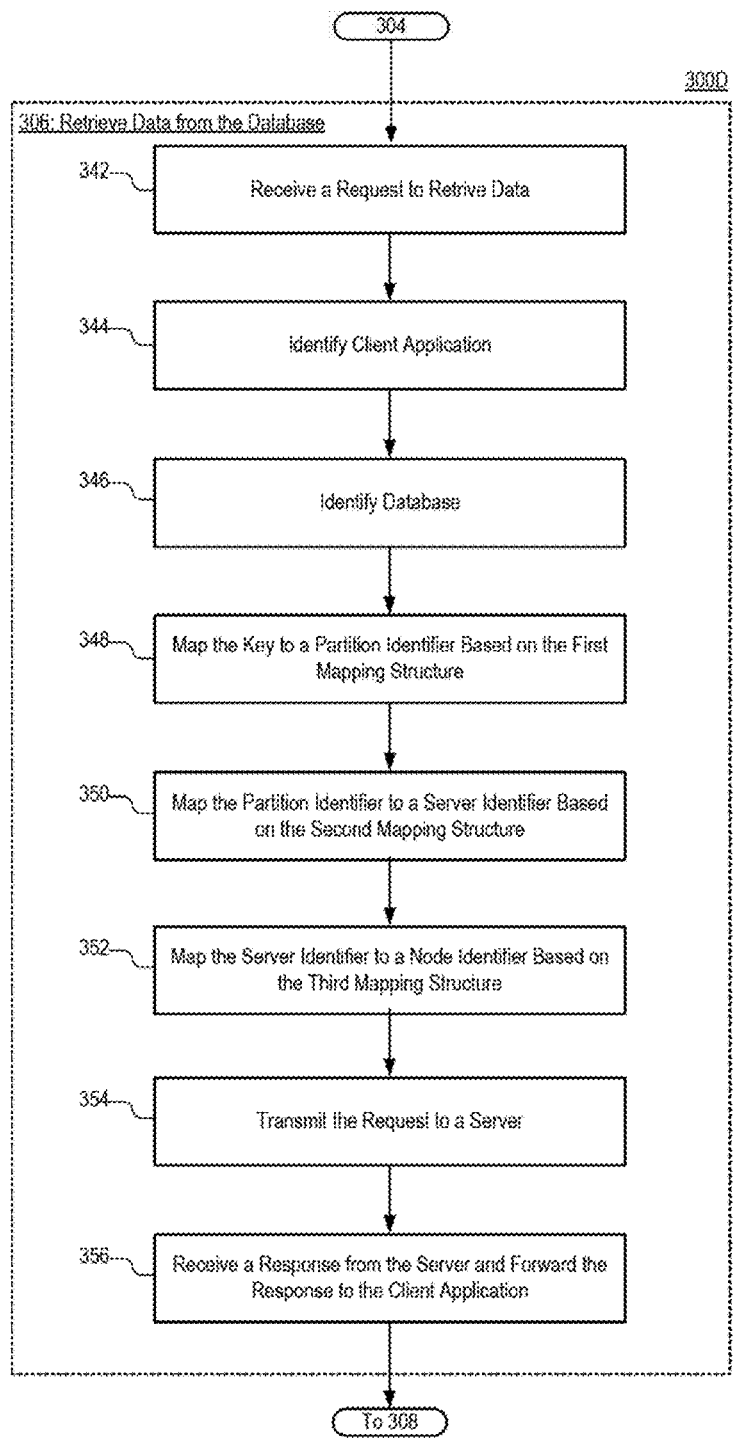
FIG. 3D is a diagram of an example of a process for retrieving data from a database in accordance with some embodiments.

FIG. 3D depicts a flowchart of an example of a process 300D for retrieving data from a database in accordance with some embodiments of the disclosed subject matter. In some embodiments, process 300D may be used to perform step 306 of process 300A. As shown, at 342, a first request to retrieve data from the database is received. The first request may identify a key that is associated with the requested data. At 344, the identity of a client and/or application that issued the first request is determined. In some embodiments, this determination can be based on data from a client authentication process. At 346, the identity of a database (or bucket) that the client is attempting to access is determined. In some embodiments, the identity of the database (or bucket) may be determined by looking at the destination port of the TCP connection from which the first request has been received. Step 346 may be performed when DMC 202 and/or CNM 204 control the operation of other databases, in addition to the database discussed with respect to process 300A.

At 348, the key is mapped to a partition ID in order to identify the partition that the requested data is part of. In some embodiments, the mapping may be performed by using the first mapping structure. Additionally or alternatively, as noted above, the mapping can be performed by hashing the key against the database (or bucket) partition space (as defined by a hashing function) to get a partition ID. At 350, the partition ID is mapped to a server ID in order to identity the server that is hosting the partition. In some embodiments, the mapping may be performed based on the second mapping structure. Thus, a server may be considered to host a partition when an ID of that server is associated with an ID of the partition by second mapping structure. At 352, the server ID is mapped to a node ID in order to identify the physical hardware (e.g., computer or the virtual machine) that is executing the server identified at step 350. In some embodiments, the mapping may be performed based on the third mapping structure. At 354, a second data request is transmitted to the identified server. The second data request may be based on the key received as part of the first data request. At 356, a response to the second data request is received from the identified server and forwarded to the client application that originated the first request.

In some embodiments, the first request may include a plurality of keys. In such situations, a second query may be generated for each one of the plurality of keys and transmitted to a server that is associated with the key. Each key's associated server, as discussed above, may be identified by executing steps 324-354 for that key (i.e., by mapping the key to a partition ID and then mapping the partition ID to a server ID). Once responses to all second requests are received, a response to the first query may be generated by aggregating the responses to the second queries. The generated response may be transmitted afterwards to the application that originated the first request.

Figure 3E:
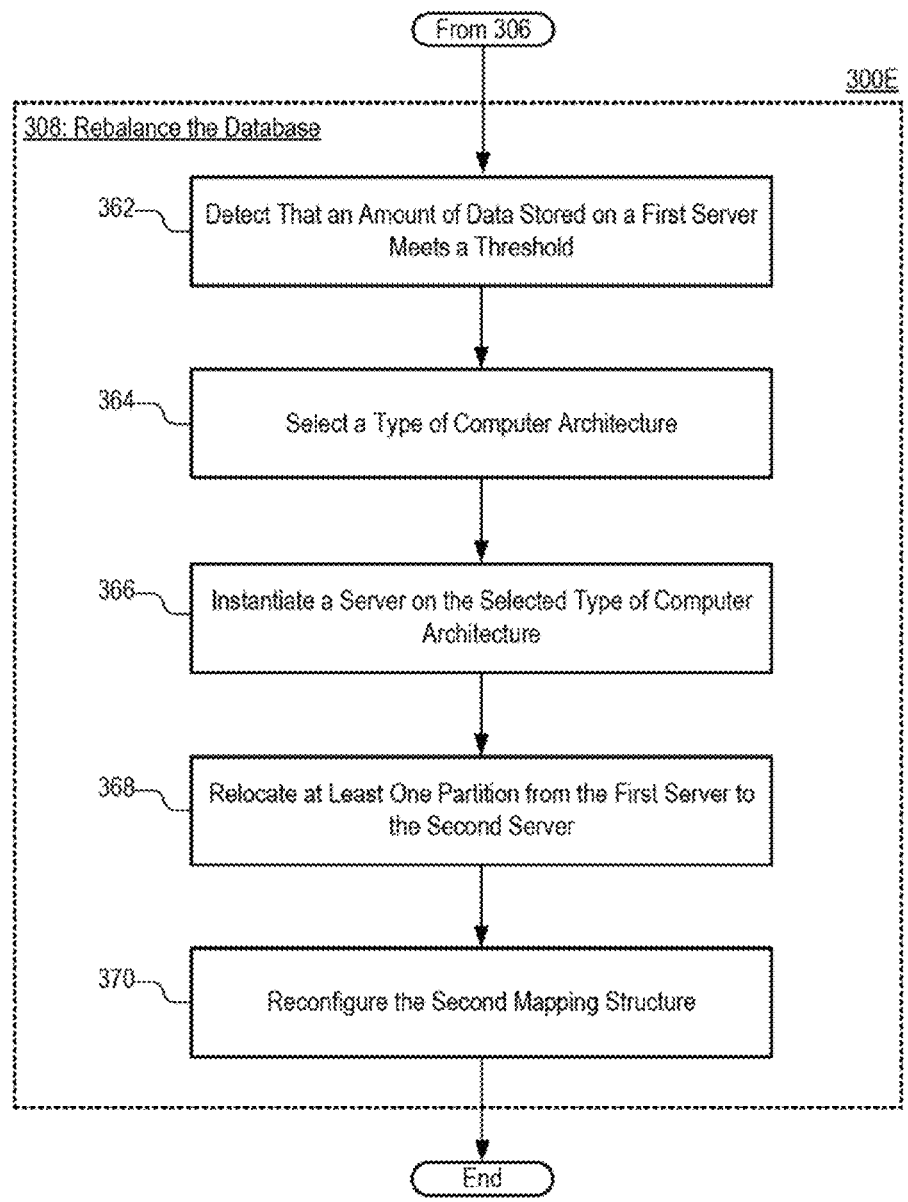
FIG. 3E is a diagram of an example of a process for rebalancing a database in accordance with some embodiments.

FIG. 3E depicts a flowchart of an example of a process 300E for relocating partitions from a first server to a second server in accordance with some embodiments of the disclosed subject matter. In some embodiments, process 300E may be used to perform step 308 of process 300A. At step 362, a first server detects that an amount of data stored on that server meets (e.g., exceeds or equals) a threshold. In some embodiments, the threshold may be based on the architecture that is used to implement the first server. For example, in embodiments in which the first server is implemented using 32-bit software, the threshold may be less than or equal to 4096 MB. In some embodiments, the threshold may be set manually by a system administrator or a designer, such as a programmer (or a software engineer) of the server software. Additionally or alternatively in some embodiments, the threshold may be determined automatically, based on the type of architecture that is used to implement the first server. For example, in instances where the first server is implemented in 32-bit computer software, the first server may set the threshold to lower or equal to a first value and in instances where the first server is implemented in a 64-bit architecture, the first server may set the threshold to a second value that is greater than the first value. Regardless of whether the threshold is set manually or automatically, in some embodiments, the threshold may be based on the type of computer architecture (e.g., 128-bit, 64-bit, 32-bit, 16-bit or 8-bit) for which the first server is compiled.

At 364, a type of server may be selected. In some embodiments, a choice may be made between a low-bit server and a high-bit server. The high-bit server may include any server software that has a larger address space than the low-bit server. For example, in some embodiments, the low-bit server may include software that is compiled for a 32-bit computer architecture (i.e., 32-bit server software) and the high-bit server may include software that is compiled for a 64-bit architecture (i.e., 64-bit server software). In some embodiments, the choice between a low-bit server and a high-bit server may be based on the size of a partition that is hosted on the first server. For example, if the partition that is stored on the first server is approaching or exceeding a predetermined threshold (e.g., 4096 MB), that partition may need to be moved to a 64-bit server in order to permit that partition to be expanded beyond the address space limit of 32-bit software. In some embodiments, the size of a partition may be based on the sum of the sizes of all database objects that are stored in the database whose keys are associated with the partition by the first mapping structure.

At 366, a second server is instantiated. In some embodiments, the second server ma be instantiated from the server software selected at step 364. The second server may be instantiated on the node where the first server is executed or on another node. At 368, one or more partitions that are stored on the first server are relocated to the second server. In some embodiments, relocating the partitions may include: selecting, a subset of partitions that are associated with the first server by using a mapping structure, such as the second mapping structure (e.g., identifying one or more partitions associated with the first server); identifying data associated with the selected partitions (e.g., by using a mapping structure, such as the first mapping structure); and copying the identified data to the to the second server.

In some embodiments, each of the selected partitions may be selected based on a characteristic of the selected partition, such as size of data corresponding to the partition. Additionally or alternatively, each of the selected partitions may be selected based on a predetermined rule (e.g., "select the partition with the largest amount of corresponding data").

In some embodiments, relocating the one or more partitions may include: transmitting an image including all data stored on the first server (e.g., a snapshot) to the second server; deleting data corresponding to the partitions that are desired to be relocated from the first server; and on the second server deleting data corresponding to the partitions that are not desired to be relocated from the first server.

At 370, the second mapping structure is updated. Updating the second mapping structure may include configuring the second mapping structure to relate the IDs of the partitions that are relocated with an ID of the second server. Furthermore, in some embodiments, updating the second mapping structure may include removing from the second mapping structure any associations between IDs of the relocated partitions and the ID of the first server. Reconfiguring the mapping structure may result in subsequent requests for data associated with the relocated partitions to be routed to the second server and not to the first one. As noted above, in some embodiments, in order for data to be associated with a given partition, the keys of database objects for that data may need to be mapped to the ID of the given partition by the first mapping structure.

Figure 3F:
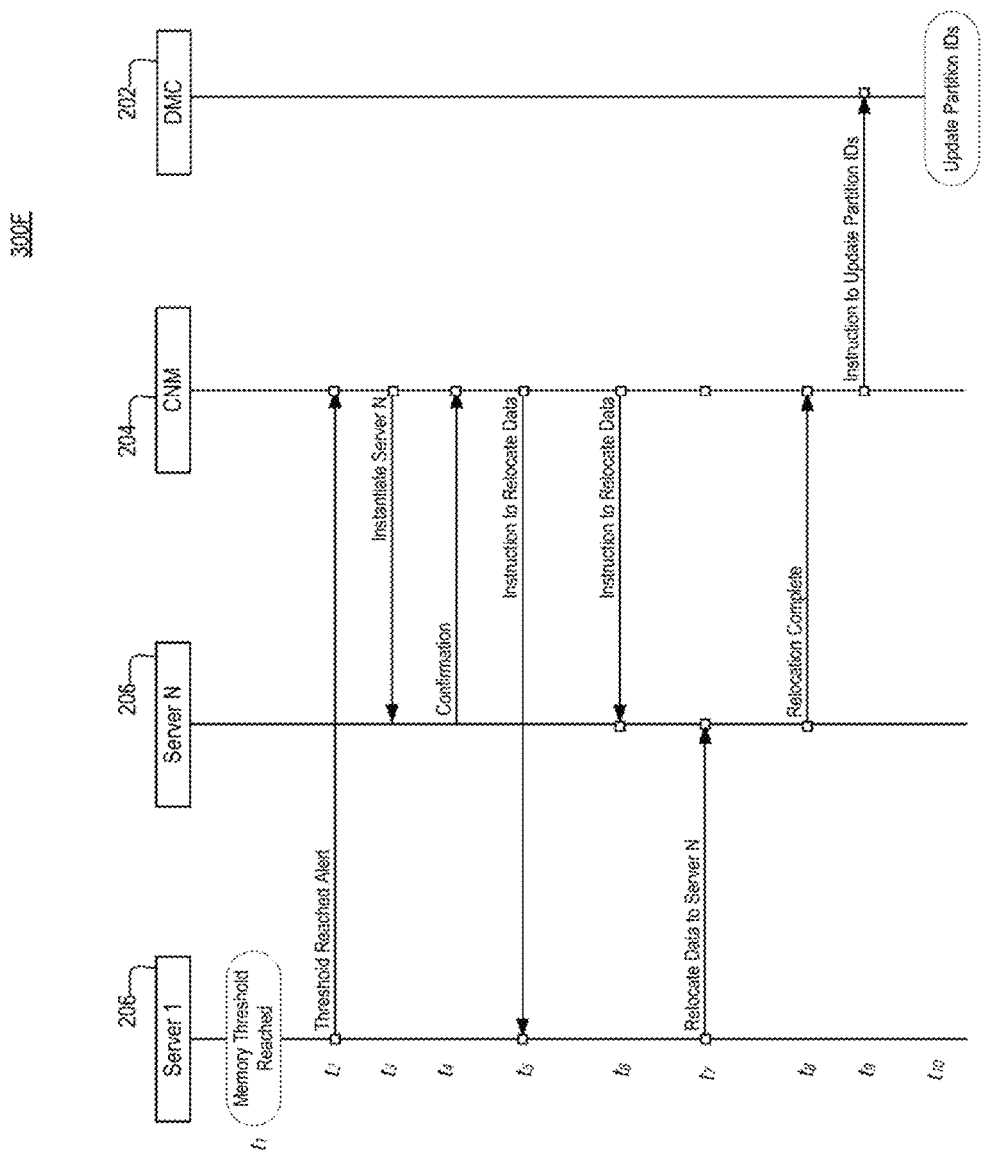
FIG. 3F is a diagram of an example of another process for rebalancing a database in accordance with some embodiments.

FIG. 3F depicts a flowchart of a process 300F for rebalancing a database in accordance with some embodiments of the disclosed subject matter. In some embodiments, process 300F may be used to perform step 308 of FIG. 3A. As shown, at time $t_1$, a first server (e.g., one of servers 206) may detect that a threshold is met. In some embodiments, the threshold may be met when the amount of data stored on that server has exceeded a predetermined amount or when any other suitable condition is satisfied. At time $t_2$, the first server transmits a message to CNM 204 indicating that the threshold has been met. At time $t_3$, in response to the message, a second server is instantiated by CNM 204. The second server may be instantiated, on node 200 or on another node. At time $t_4$, the second server transmits a message to CNM 204 indicating that the instantiation of the second server has completed.

At time $t_5$, CNM 204 transmits an instruction to the first server to relocate one or more of the partitions stored on the first server to a second server. The instruction may include any suitable type of instruction, in some embodiments. Additionally or alternatively, the instruction may include an identifier of the partitions that are to be relocated, identifier of the database that the partition is part of, and/or any other suitable type of identifier. When received at the first server, the instruction may cause the first server to fulfill a subsequent request from the second server for the data that is being relocated.

At time $t_6$ the CNM 204 transmits an instruction to the second server to retrieve one or more partitions from the first server. In some embodiments, the instruction may include an identifier of the partitions that are to be relocated, identifier of the database that the partition is part of, and/or any suitable type of identifier.

At time $t_7$, the second server retrieves the requested partitions from the first server. At time $t_8$, the second server transmits a message to CNM 204 indicating that the relocation has completed.

At time $t_9$, CNM 204 transmits an instruction to DMC 202 to update partitions associated with data that has been relocated from the first server. In some embodiments, the instruction may include an indication of the relocated data and/or one or more second keys associated with the relocated data. At time $t_{10}$, the IDs of the relocated partitions are updated. In some embodiments, updating the IDs of the relocated partitions may include associating the IDs for the relocated partitions with the ID of the server instantiated at time $t_3$. In some embodiments, the association may be performed by updating the second mapping structure to relate the IDs for the relocated partitions to the ID of the newly-instantiated server.

In some embodiments, any messages, communications, and/or instructions transmitted between the first server, the second server, DMC 202, and CNM 204 may be transmitted over a communications network, such as TCP/IP network, a LAN, or any suitable type of network. Additionally or alternatively, any messages, communications, and/or instructions transmitted between the first server, DMC 202, and CNM 204 may be transmitted by using any suitable inter-process communications method (or protocol). The inter-process communications method (or protocol) may be effectuated over an internal data bus (e.g., PCI, PCIe, FSB), over a communications network (e.g., TCP/IP, InfiniBand), and/or over any other suitable means for communications.

Returning to FIG. 2, DMC 202 can also be used to perform client authentication in some embodiments. Any suitable one or more client authentication mechanisms can be used. For example, Simple Authentication and Security Layer (SASL) authentication, password authentication, source IP authentication, Amazon Web Service Security Group, and/or any other suitable authentication mechanisms can be used in some embodiments.

Any suitable mechanism for identifying a server in a node can be used. For example, a server can be identified by a port number that is appended to an IP address of a node (e.g., NodeIP:ServerPort).

In accordance with some embodiments, DMC 202 can also be used to perform protocol translation. For example, in some embodiments, DMC 202 can perform a translation from a protocol used by clients/applications requesting data to a protocol used by servers 206. More particularly, for example, a client/application can request data using Memcached ASCII, Memcached binary, Redis old protocol, Redis unified protocol, and/or any other suitable protocol. Servers 206 can communicate using a Redis unified protocol modified to include extensions that allows the servers to support operations which are natively not supported by a Redis server (e.g., Memcached commands) without breaking the Redis unified protocol semantics. And DMC 202 can perform a translation between these protocols.

For example, in accordance with some embodiments, DMC 202 can perform translation between the Memcached protocol and a modified Redis unified protocol. In doing so, the following can be performed. First, a client may issue a Memcached cas command using the following format: cas <key> <flags> <exptime> <bytes> <cas unique> [noreply] \r\n. Note that cas is a check and set operation, which means "store this data but only if no one else has updated since I last fetched it." This command can then be translated to a new command, RCAS, using the following format RCAS <key> <flags> F(<exptime>) <cas unique> <bytes/body>.

In doing so, the DMC can perform the following steps when translating a Memcached cas command received from the client to the new RCAS command. If a noreply argument is used by the client, the DMC does not forward this argument to the server. Instead the DMC remembers that the initial request included this option, and therefore will not transfer the Redis reply to the client. If Memcached expiration time (exptime) uses Unix time format, the DMC can translate the Unix time to offset in seconds from the current time. The DMC can then receive a response to the RCAS command as follows. A "+OK\r\n" response can be received, which indicates success. A "–NOT_STORED" response can be received, which indicates that the data was not stored, but not because of an error. A "–EXIST" response can be received, which indicates that the item trying to be stored with the RCAS command has been modified since it was last fetched. A "–NOT_FOUND\r\n" response can be received, which indicates that the item trying to be stored with a RCAS command did not exist or has been deleted. These received messages can then respectively be translated to "STORED\r\n", "NOT_STORED", "EXIST\r\n", and "NOT_FOUND" of the Memcached protocol.

DMC 202 can also perform load balancing in some embodiments to balance loads among a master server 206 (which can respond to read and write requests for data objects) for a database (or bucket) partition and one or more slave servers 206 (which can respond to read requests for data objects) for the same partition. For example, in some embodiments, the DMC for a partition that resides over multiple servers 206 (e.g., one master server and N (zero or more) slave servers), can redirect a request for a data object on that partition to a relevant least used server 206 based on shared usage statistics.

Figure 4:
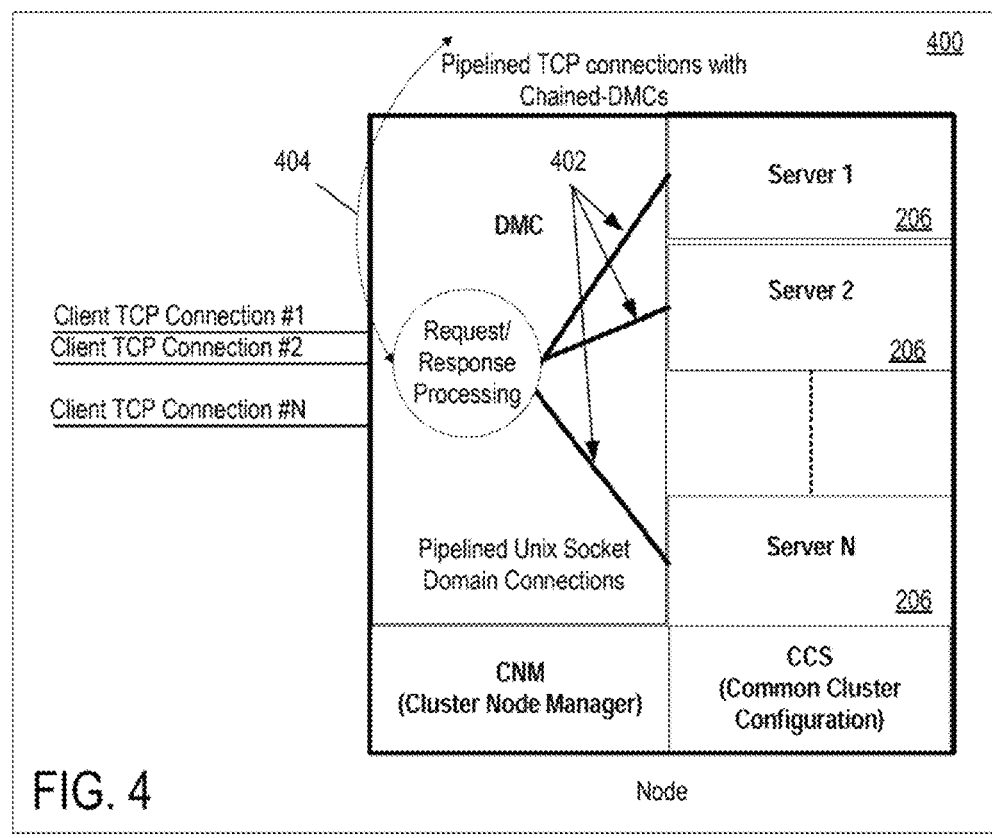
FIG. 4 is a diagram of an example of a connection between a data management controller and servers and other data management controllers in accordance with some embodiments.

In some embodiments, DMC 202 can redirect requests to and responses from a node on which a data object is stored when a request for that data object is received at the wrong node. In some embodiments, this redirection of responses can occur via dedicated connections 404 to one or more other DMCs in other nodes as shown in FIG. 4 or one or more servers in other nodes.

To improve the performance of servers 206, DMC 202 can perform connection pooling in some embodiments. Any suitable technique for connection pooling can be used in some embodiments. For example, as shown in FIG. 4, in some embodiments, the DMC can maintain a number of connections 402 with each server 206 so that each addition or removal of a connection from a server will degrade its throughput and increase its latency. In some embodiments, connections 402 between a DMC 202 and servers 206 can be long-lived, persistent connections that reduce the overhead associated with connection setup and teardown between client and server.

To improve the performance of servers 206, DMC 202 can additionally or alternatively use Unix domain socket connections between the DMC and the servers in some embodiments. When the DMC and the server reside on the same physical/virtual machine, Unix domain socket connections can be used to eliminate the processing overhead associated with managing TCP connection between the DMC and the servers.

To improve the performance of servers 206, DMC 202 can additionally or alternatively perform request pipelining in some embodiments. Requests can be pipelined by the DMC by sending multiple requests to the same server before responses to the earlier of those requests are received from the server on requests that were previously sent on the same connection.

In some embodiments, the number of connections and the size of a pipeline between DMC 202 and each server 206 can additionally or alternatively be changed based on the average object size in the server. For example, in some embodiments, when the average object size in a server is less than 1 kB, the DMC may open fewer (or reduce the number of) persistent connections with the server and increase the pipeline size (i.e., the number of requests that can be sent to the server without waiting for its response). However, when the average file size is over 20 kB, for example, the DMC may increase the number of persistent connections with the server and reduce the pipeline size.

In some embodiments, the DMC can additionally or alternatively prioritize light processing requests over heavy processing requests coming from different client connections. Any suitable basis for selecting a processing request as being light or heavy can be used in some embodiments. For example, a Redis GET request can be considered to be a light request, where as a Redis ZRANGEBYSCORE request can be considered to be a heavy request.

In some embodiments, the DMC can additionally or alternatively send the same response to multiple requesters when a read request for a data object is received while another read request for the same data object has already been sent b the DMC to a server, but a corresponding response not received. In doing so, the DMC can queue one or more later requests until the response for the first request is received. The DMC can then send that response to the client that sent the first request and to all the clients with queued requests.

In some embodiments, the DMC can additionally or alternatively provide a cache for frequently requested data objects. In some embodiments, the frequently requested objects can be more frequently requested than the frequently requested objects similarly replicated across servers 206 as described below.

In accordance with some embodiments, data management controller (DMC) 202 can be used to manage the data flow of node 200, to manage the data flow between node 200 and one or more other nodes in the same cluster, and to manage the data flow between node 200 and one or more nodes in another cluster.

In accordance with some embodiments, Cluster Node Manager CNM 204, as a cluster manager can make auto-sharding (scaling-out) decisions when a specific database (or Bucket) has to be split over more than one server due to load or memory constraints. This can be accomplished in any suitable manner. For example, the CNM can instruct a server to send one or more user data set partitions to a new server, and then the CNM can instruct the DMC to redirect requests destined to this partition(s) to the new server. Similarly, in some embodiments, CNM 204 as a cluster manager can make auto-merging (scaling-in) decisions when a specific database (or Bucket) has to be merged from two or more servers to fewer servers due to reduced load or a reduction in memory size. This can be accomplished in any suitable manner. For example, the CNM can instruct a server to send one or more user data set partitions to a target server that already manages a portion of the user data set, and then the CNM can instruct the DMC to redirect requests destined to this partition(s) to the target server.

In accordance with some embodiments, cluster node manager (CNM) 204 can be used to perform node management functions and cluster management functions. For example, the cluster node manager can be used to monitor the status of each node, configure the node, control inter- and intra-node communications, elect nodes for aggregation and supervision functions, and provide a management interface for the cluster operation.

In accordance with some embodiments, CNM 204 as a node manager can monitor for failures and/or degraded status in other nodes and in servers of its own node. Any suitable mechanism can be used for determining that another node or server has failed or become degraded in some embodiments. For example, in some embodiments, periodic messages can be sent out by each server in a node to the CNM of the node. The CNM can detect a failure when a message is missing. As another example, in some embodiments, each CNM can send out a periodic message to CNM(s) in one or more other nodes. The CNM(s) in the one or more other nodes can detect a failure when this message is missing. As yet another example, each server can send out a memory fragmentation status message to the CNM in the same node to alert the CNM if its performance has become degraded. Any suitable action can be taken in response to a failure or degraded status. For example, in some embodiments, a CNM can cause a server or another node to restart its software upon a failure being detected, to perform a de-fragmentation process upon a degraded status being detected, etc. In some embodiments, when the fragmentation ratio crosses a pre-defined threshold, the following can be performed: (1) another server on the same node or on a different node can be started; (2) the fragmented server can be backed-up; (3) all clients can be switched to the new server; and (4) the fragmented server can be released.

In some embodiments, CNM 204 as a node manager can receive, process, and monitor local configuration data, and/or monitor and collect node statistics, such as DMC statistics and server statistics.

In some embodiments, CNM 204 as a node manager can translate server statistics to other non-relational database statistics. For example, when a Memcached user asks to get his/her Memcached statistics for the user's server 206 that is based on a Redis server, the request can be forwarded to the relevant node that contains the user's server 206 that holds the user dataset, and the CNM in that node can process this request and translate the Redis statistics to Memcached statistics.

In some embodiments, CNM 204 as a node manager can provide statistics information to other components upon request.

In some embodiments, CNM 204 as a node manager can monitor the DMC and server(s) for performance alerts. For example, the CNM as a node manager can monitor cases where the throughput or the latency of the node or the server crosses pre-defined thresholds.

In some embodiments, CNM 204 as a node manager can control the load of the replication processes across the servers which reside on the same node, and control the multi-cluster replication operation of the server(s) within a node.

In some embodiments, CNM 204 as a cluster manager can manage cluster configuration by communicating with another CNM designated as a Node Configuration Manager for allocating and releasing resources.

In some embodiments, CNM 204 as a cluster manager can update the cluster DNS servers with any configuration change of the database (or Bucket). These updates can be used to ensure that only one protocol hop will be used between the clients and the cluster nodes in some embodiments.

In some embodiments, CNM 204 as a cluster manager can maintain a global configuration map that maps of all users datasets (e.g., databases or Buckets) with their partitions to cluster nodes and servers. In some embodiments, when the CNM receives a request to create a user dataset, or receives a request to increase the size of a user dataset, the CNM can perform an admission control process which will look for additional resources over existing nodes of a cluster or alternatively will add a new node to the cluster. In some embodiments, when the CNM receives a request to delete a user dataset, or receives a request to decrease the size of a user data set, the CNM can perform an admission control process which will release the resources.

In some embodiments, CNM 204 as a cluster manager can maintain a global rebalancing process in order to ensure that all resources of a cluster are spread equally across nodes.

In some embodiments, CNM 204 as a cluster manager can forward monitoring requests from the system manager to the proper CNM and aggregate statistics from multiple servers that serve the same database (or Bucket). Information about levels of utilization of the servers 206 can be exchanged between cluster node managers (CNM) 204 in different nodes.

In some embodiments, CNM 204 as a cluster manager, together with the relevant another CNM designated as a Node Replication Controller, can perform cross-clusters replication operations.

In some embodiments, DMC 202 and CNM 204, each of which is a control process, can be combined to form a combined control process.

In some embodiments, server(s) 206 can be used to provide in-memory non-relational database functionality and any other suitable server process(es). In some embodiments, the server(s) can be based on the open-source Redis server with enhanced functionality. In some embodiments, the server(s) can represent one of the following options: (1) a Memcached Bucket; (2) a partition of a Memcached Bucket; (3) a Redis database (DB); or (4) a partition of a Redis DB.

In some embodiments, each cluster's node includes N servers, and there can be any suitable number of servers, including zero, in some embodiments.

In some embodiments, in addition to functionality performed by a Redis server, server 206 can also support data operations which are not natively supported by a Redis server, such as cas and prepend commands and flag and cas arguments of Memcached. Commands and arguments which are not natively supported by the Redis server are transmitted to server 206 using the extension(s) of the modified Redis unified protocol, which extends the supported Redis command while preserving Redis unified protocol semantics. Server 206 supports these extensions by adding new elements to the object key data structure and by implementing the command logic behind the new commands. Examples for the new elements that are added to the Redis Object Key Data Structure are:
  i. flags field: to support the Memcached flag functionality and
  ii. cas field: to support the Memcached cas functionality.

In some embodiments, in addition to functionality performed by a Redis server, the server can also perform real-time (or near real-time) class-based compression. In order to perform this compression, in some embodiments, a set of global dictionaries for finding duplicated strings across multiple objects can be provided. These dictionaries can treat all the non-relational objects that belong to a certain class as a one big object. As a result, an object can be compressed based on many data patterns which appeared in objects previously processed by the compression process.

Any suitable compression dictionaries can be used in some embodiments. For example, the compression dictionaries can be a LZW/LZ78 dictionary, a LZP dictionary, or any other suitable compression dictionary.

These dictionaries can be saved globally and can be not attached to each object, which provides additional reduction in the size of each compressed object, in some embodiments.

In some embodiments, a classification mechanism can be used to classify objects according to data patterns that were found in the objects and can provide a dedicated global dictionary per object class. This mechanism can find new classes of objects and merge classes of objects. As a result, the total size of each compression dictionary can be reduced, which contributes to additional enhancement in the compression ratio.

In some embodiments, in addition to functionality performed by a Redis server, a real-time (or near real-time) compaction mechanism for cached objects can be provided. In some embodiments, this compaction mechanism can delete cached objects immediately (or a soon after) after they have been expired.

In some embodiments, in addition to functionality performed by a Redis server, a mechanism for storing frequently used objects in a partition that is replicated across multiple nodes can be provided. In this way, multiple nodes can each serve the frequently used objects simultaneously thus improving performance. In some embodiments, these frequently used objects can always be stored in an uncompressed format.

In accordance with some embodiments, CCS 208 is an internal cluster repository service (based on the Redis architecture). In some embodiments, this service can include a per node and a per-cluster configuration, statistics, and alert information. All the nodes in a cluster can be synchronized with the per-cluster configuration. The DMC and CNM can be registered to the CCS to receive configuration change events which are relevant to their operations.

As shown in FIG. 1, in accordance with some embodiments, each cluster can include one or more Backup Nodes 112.

In some embodiments, the cluster architecture described herein can be provided as a service. A user of this service can be registered through the service manager (SM), which communicates with a CNM designated as a Cluster Orchestrator to allocate user resources in the cluster. In some embodiments, the SM may allocate resources across multiple clusters.

In some embodiments, a user resource can be a Memcached Bucket, a Redis database (DB), or any other suitable non-relational database. Each database (or bucket) can be hosted over one or more servers 206, depending on the transaction load imposed and the memory size of its dataset. In some embodiments, each database (or bucket) can be composed of multiple partitions (e.g., 4096 or any other suitable number). In some embodiments, keys can be equally spread over the different partitions by applying a hash function technique. Partition space may scaled dynamically (in or out) if necessary, using a consistent hashing algorithm.

In some embodiments, a partition in a cluster can be hosted by one master server 206, and by zero or more slave servers 206. Master servers can serve both read and write requests, and slave servers can only serve read requests, in some embodiments.

When a database (or a bucket) is created, the user can be provided with a single DNS address or a list of DNS addresses to be used for accessing the database (or the bucket) in some embodiments. The user then needs to configure its application servers to use these addresses. This list can include DNS addresses for both master and slave servers 206 that hold the database (or the bucket). Multiple DNS addresses may point to the same server 206.

Application requests may be sent directly to the node where the key is hosted, or may be redirected to that node by another node (through the DMC).

In embodiments in which servers 206 are implemented using 32-bit computer software, populator 210 may be used to import existing 64-bit data sets into servers 206. The dataset, in some instances, may be provided to populator 210 by a system administrator or another entity that is responsible for migrating the 64-bit dataset to the 32-bit storage of servers 206. Populator 210 may issue a series of commands to DMC 202 instructing DMC 202 to store the data set in servers 206. The commands may be executed in the manner discussed with respect to FIG. 3C.

In accordance with some embodiments, any one or more node, any one or more cluster, the service manager, and the DNS can be implemented in one or more general or special purpose devices, such as a general purpose computer, a special purpose computer, a client, a server, etc. Any of these general or special purpose devices can include any suitable components such as one or more hardware processor (each of which can be a microprocessor, digital signal processor, a controller, etc.), memory, communication interfaces, display controllers, input devices, etc. Any one or more of the connections between different components herein can be formed from any suitable communication link or combination of communication links. For example, the communication links can include the Internet, a local area network, a wide area network, a telephone network, a satellite network, a cable network, etc.

In some embodiments, any suitable computer readable media can be used for storing instructions for performing the processes described herein. For example, in some embodiments, computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as flash memory, electrically programmable read only memory (EPROM), electrically erasable programmable read only memory (EEPROM), etc.), any suitable media that is not fleeting or devoid of any semblance of permanence during transmission, and/or any suitable tangible media. As another example, transitory computer readable media can include signals on networks, in wires, conductors, optical fibers, circuits, any suitable media that is fleeting and devoid of any semblance of permanence during transmission, and/or an suitable intangible media.

It should be noted that FIGS. 3A-F are provided as examples only. At least some of the steps of processes 300A-F may be performed in a different order than represented, performed concurrently, or omitted. Although the invention has been described and illustrated in the foregoing illustrative implementations, it is understood that the present disclosed subject matter has been made only by way of example, and that numerous changes in the details of implementation of the invention can be made without departing from the spirit and scope of the invention, which is limited only by the claims which follow. Features of the disclosed implementations can be combined and rearranged in various ways. It will also be understood that the provision of the examples described herein (as well as clauses phrased as "such as," "e.g.", "including" and the like) should not be interpreted as limiting the claimed subject matter to the specific examples; rather, the examples are intended to illustrate only some of many possible aspects.

Although the invention has been described and illustrated in the foregoing illustrative embodiments, it is understood that the present disclosure has been made only by way of example, and that numerous changes in the details of implementation of the invention can be made without departing from the spirit and scope of the invention, which is only limited by the claims which follow. Features of the disclosed embodiments can be combined and rearranged in various ways.

What is claimed is:

1. A method for managing an in-memory NoSQL database comprising:
   receiving a dataset;
   splitting, by a hardware processor, the dataset into a plurality of parts of the dataset, wherein one of the plurality of parts of the dataset includes a plurality of partitions;
   storing each of the plurality of parts of the dataset in a separate one of a plurality of 32-bit software architecture in-memory NoSQL databases;
   storing data in the one of the plurality of parts of the dataset;
   determining an amount of data stored in the one of the plurality of parts of the dataset;
   determining whether the amount meets a threshold;
   responsive to determining that the amount meets the threshold, determining whether the one of the plurality of parts of the dataset can be split into a plurality of sub-parts of the dataset, wherein each of the sub-parts of the dataset includes at least one of the plurality of partitions, and whether at least one of the plurality of sub-parts of the dataset can be stored in a 32-bit software architecture in-memory NoSQL database; and
   responsive to determining that the one of the plurality of parts of the dataset can be split into a plurality of sub-parts of the dataset, wherein each of the sub-parts of the dataset includes at least one of the plurality of partitions, and that the at least one of the plurality of sub-parts of the dataset can be stored in a 32-bit software architecture in-memory NoSQL database, splitting the one of the plurality of parts of the dataset into a plurality of sub-parts of the dataset, wherein each of the sub-parts of the dataset includes at least one of the plurality of partitions, and storing the at least one of the plurality of sub-parts of the dataset in a 32-bit software architecture in-memory NoSQL database; and
   responsive to determining that the one of the plurality of parts of the dataset cannot be split into a plurality of sub-parts of the dataset, wherein each of the sub-parts of the dataset includes at least one of the plurality of partitions, or that the at least one of the plurality of sub-parts of the dataset cannot be stored in a 32-bit software architecture in-memory NoSQL database, scaling the one of the plurality of parts of the dataset to a 64-bit software architecture in-memory NoSQL database.

2. The method of claim 1, wherein the dataset is received from a 64 bit software architecture in-memory NoSQL database.

3. A system for managing an in-memory NoSQL database, comprising:
   a hardware processor that is configured to:
   receive a dataset;
   split the dataset into a plurality of parts of the dataset, wherein one of the plurality of parts of the dataset includes a plurality of partitions;
   store each of the plurality of parts of the dataset in a separate one of a plurality of 32-bit software architecture in-memory NoSQL databases;
   store data in the one of the plurality of parts of the dataset;
   determine an amount of data stored in the one of the plurality of parts of the dataset;
   determine whether the amount meets a threshold;
   responsive to determining that the amount meets the threshold, determine whether the one of the plurality of parts of the dataset can be split into a plurality of sub-parts of the dataset, wherein each of the sub-parts of the dataset includes at least one of the plurality of partitions, and whether at least one of the plurality of sub-parts of the dataset can be stored in a 32-bit software architecture in-memory NoSQL database; and
   responsive to determining that the one of the plurality of parts of the dataset can be split into a plurality of sub-parts of the dataset, wherein each of the sub-parts of the dataset includes at least one of the plurality of partitions, and that the at least one of the plurality of sub-parts of the dataset can be stored in a 32-bit software architecture in-memory NoSQL database, split the one of the plurality of parts of the dataset into a plurality of sub-parts of the dataset, wherein each of the sub-parts of the dataset includes at least one of the plurality of partitions, and store the at least one of the plurality of sub-parts of the dataset in a 32-bit software architecture in-memory NoSQL database; and
   wherein the hardware processor is further configured to:
   responsive to determining that the one of the plurality of parts of the dataset cannot be split into a plurality of sub-parts of the dataset, wherein each of the sub-parts of the dataset includes at least one of the plurality of partitions, or that the at least one of the plurality of sub-parts of the dataset cannot be stored in a 32-bit software architecture in-memory NoSQL database, scale the one of the plurality of parts of the dataset to a 64-bit software architecture in-memory NoSQL database.

4. The system of claim 3, wherein the dataset is received from a 64 bit software architecture in-memory NoSQL database.

5. A non-transitory computer-readable medium containing computer-executable instructions that, when executed by a processor, cause the processor to perform a method for managing an in-memory NoSQL database, the method comprising:
   receiving a dataset;
   splitting, by a hardware processor, the dataset into a plurality of parts of the dataset, wherein one of the plurality of parts of the dataset includes a plurality of partitions;
   storing each of the plurality of parts of the dataset in a separate one of a plurality of 32-bit software architecture in-memory NoSQL databases;
   storing data in the one of the plurality of parts of the dataset;
   determining an amount of data stored in the one of the plurality of parts of the dataset;
   determining whether the amount meets a threshold;
   responsive to determining that the amount meets the threshold, determining whether the one of the plurality of parts of the dataset can be split into a plurality of sub-parts of the dataset, wherein each of the sub-parts of the dataset includes at least one of the plurality of partitions, and whether at least one of the plurality of sub-parts of the dataset can be stored in a 32-bit software architecture in-memory NoSQL database;
   responsive to determining that the one of the plurality of parts of the dataset can be split into a plurality of sub-parts of the dataset, wherein each of the sub-parts of the dataset includes at least one of the plurality of partitions, and that the at least one of the plurality of sub-parts of the dataset can be stored in a 32-bit software architecture in-memory NoSQL database, splitting the one of the plurality of parts of the dataset into a plurality of sub-parts of the dataset, wherein each of the sub-parts of the dataset includes at least one of the plurality of partitions, and storing the at least one of the plurality of sub-parts of the dataset in a 32-bit software architecture in-memory NoSQL database; and wherein the method further comprises:

responsive to determining that the one of the plurality of parts of the dataset cannot be split into a plurality of sub-parts of the dataset, wherein each of the sub-parts of the dataset includes at least one of the plurality of partitions, or that the at least one of the plurality of sub-parts of the dataset cannot be stored in a 32-bit software architecture in-memory NoSQL database, scaling the one of the plurality of parts of the dataset to a 64-bit software architecture in-memory NoSQL database.

6. The non-transitory computer-readable medium of claim 5, wherein the dataset is received from a 64 bit software architecture in-memory NoSQL database.

* * * * *